United States Patent
Schroeder et al.

[11] Patent Number: 6,123,301
[45] Date of Patent: Sep. 26, 2000

[54] HORIZONTAL-MOUNT BRACKET SYSTEM FOR HOLDING AND LOCKING SENSOR POSITION

[75] Inventors: Thaddeus Schroeder, Rochester Hills; Robin Stevenson, Bloomfield, both of Mich.

[73] Assignee: Delphi Technologies, Inc., Troy, Mich.

[21] Appl. No.: 09/316,370

[22] Filed: May 21, 1999

[51] Int. Cl.[7] .............................. F16M 11/00; A47F 5/00; A47H 1/10; F16B 25/00
[52] U.S. Cl. .......................... 248/200; 248/300; 411/386
[58] Field of Search .............................. 248/74.3, 71, 65, 248/200, 201, 300, 316.2, 231.31; 29/525.01, 525.02, 525.03, 464; 411/399, 386, 426; 403/408.1, 373

[56] References Cited

U.S. PATENT DOCUMENTS

| | | | |
|---|---|---|---|
| 2,963,090 | 12/1960 | Cole et al. | 403/408.1 |
| 3,176,808 | 4/1965 | Matthews | 411/399 |
| 3,884,002 | 5/1975 | Logie | 52/285 |
| 5,024,051 | 6/1991 | Glass et al. | 411/366 |
| 5,230,137 | 7/1993 | Abe | 403/408.1 |
| 5,326,206 | 7/1994 | Moore | 411/386 |
| 5,704,749 | 1/1998 | Landgrabe | 411/386 |

*Primary Examiner*—Ramon O. Ramirez
*Assistant Examiner*—Jon A. Szumny
*Attorney, Agent, or Firm*—Margaret A. Dobrowitsky

[57] ABSTRACT

A horizontal-mount bracket system for holding a sensor position with respect to a horizontal-mount bracket once the air gap is first established by the gauging layer method; and, in a second embodiment thereof, for locking the sensor position with respect to the horizontal-mount bracket, wherein the sensor may be removed and then reinstalled without use of any position setting procedure, yet the air gap is automatically precisely reset to its original value. First and second bracket members lay juxtaposed, wherein the first bracket member has a first sensor opening and the second bracket member has a second sensor opening. The first and second sensor openings allow free placement of the sensor body therein, and when laterally displaced, cause the sensor body to be pinched holdably to the multi-component bracket, which is attached to a flat horizontal surface of an engine.

20 Claims, 6 Drawing Sheets

HORIZONTAL-MOUNT BRACKET SYSTEM FOR HOLDING AND LOCKING SENSOR POSITION

TECHNICAL FIELD

The present invention relates to brackets for holding a first object with respect to a second object. More particularly, the present invention relates to a horizontal-mount bracket for precisely locating a sensor relative to an object to be sensed. Still more particularly, the present invention relates to a horizontal-mount bracket system, wherein facial interaction between the bracket and the body of the sensor results in the sensor being fixed positionally with respect to the bracket. The present invention is further related to air gap setting methodologies incorporating abradable setting features, wherein the air gap thereby set is captured at the bracket.

BACKGROUND OF THE INVENTION

Magnetic sensors operate on the principle of detecting magnetic flux density modulation caused by the movement of appropriately configured reluctors (or targets). The magnetic sensor must be affixed very close to the reluctor since its sensitivity decreases very rapidly with the size of the air gap between the reluctor and the magnetic sensor. In most automotive applications, for example, the air gaps are on the order of 0.3 to 1.75 mm. Over such a range of air gaps, the sensor output signal decreases more than ten times. The signal attenuation at large air gaps makes the sensor operation more prone to noise induced failures as well as less accurate in detecting the elements of the reluctor as it spins in relation to the magnetic sensor. Both of these factors are often unacceptable in critical engine control and diagnostic applications.

It may at first glance appear that there would be no problem whatsoever to choose and achieve an appropriate air gap between the magnetic sensor and the reluctor. However, in the majority of production cases, the stack-up of tolerances of the many different components randomly influence the net size of the air gap, which consequently precludes achieving, at each assembly, a precisely predetermined air gap by mere assembly of the parts. As a result, because of the random variations caused by accumulation of tolerances, mere assembly of the parts risks damaging interference between the magnetic sensor and reluctor on the one hand, and inaccurate readings associated with too large an air gap on the other hand. To lessen all the tolerances so that mere assembly assures, at each assembly, the optimum air gap is physically unrealistic and involves inordinate costs associated with manufacturing such precise parts.

The majority of magnetic sensors used in automotive applications involve non-adjustable air gap placement, wherein the stack-up of tolerances causes deviation from the optimal air gap. For example, a rigid bracket is affixed to the body of a magnetic sensor. The magnetic sensor is placed into a sensor port in the engine block, and the bracket is bolted, via a bolt hole in the bracket, to a threaded mounting hole in a mounting surface of the engine block. When the bracket is bolted, the length of the sensor body from the bolt hole of the bracket to the sensor tip determines the air gap with respect to the reluctor, which air gap is affected by the stack-up of tolerances. Even though subject to tolerance related placement inaccuracy, this structural mounting methodology is used widely because of the simplicity of the hardware, and ease of assembly and service.

In situations where air gap variation cannot be tolerated, the air gap is preset during magnetic sensor installation by means of an adjustable bracket, often referred to as a "side-mount" bracket. The adjustability of side-mount brackets resides in a bolt slot which allows for the bracket to be adjusted along the slot elongation relative to the threaded mounting hole of the mounting surface.

In one form of operation of the side-mount bracket, the sensor body is placed into the sensor port of the engine block such that the sensor tip is allowed to touch the surface of the reluctor, and then it is withdrawn a distance equal to the predetermined optimum air gap. This method is more time consuming and is error prone.

In another form of operation of the side-mount bracket, a gauging layer of soft, abradable material is placed onto the sensor tip, wherein the thickness of the gauging layer is equal to the optimum air gap. The gauging layer may be either attached to the sensor body or be a part thereof, such as a protuberance, provided the sensor body is of a soft material. Now, the installer need merely place the sensor body into the sensor port until the gauging layer touches the reluctor, and then tighten the bolt on the mounting surface to thereby hold the sensor body at this position. During initial rotation of the reluctor, a portion of the gauging layer is sacrificial to abrasion due to reluctor runout or differential thermal expansion without damage being incurred to the sensor body or the reluctor.

However, in the event the magnetic sensor must be re-installed, an abraded gauging layer cannot again provide position location for the sensor tip, as it was formerly able to do when it was unabraded. Therefore, before dismounting the magnetic sensor, the bracket must be marked to indicate the correct position of the sensor body relative to the bracket so that when the new magnetic sensor is reinstalled, its position on the bracket can be alignably sighted—not an exact procedure. Indeed, rather than try to reinstall the old, but still usable, sensor using the sighting method to reset the air gap, a technician would rather install a new sensor having the abradable layer intact, thereby circumventing the error prone sighting step otherwise needed to reinstall the old, but usable, sensor. This results in waste of otherwise good sensors and unnecessary expense for the customer or warranty provider.

Horizontal-mount brackets differ from side-mount brackets, in that a "horizontal" surface, ie., a surface normal to the vertical axis of the sensor port, is used to mount the bracket. The horizontal mount bracket involves convenience in terms of manufacture, installation and space savings as compared to the side-mount bracket, which requires the presence of a vertical surface adjacent the sensor port. Problematically, however, horizontal-mount brackets are not known to be compatible with the gauging layer sensor positioning method.

Accordingly, what remains needed in the art, is some way to enable a horizontal-mount bracket to be compatible with the gauging layer method of sensor positioning, and further, elimination of the error prone sighting method for reinstallation of a previously removed sensor.

SUMMARY OF THE INVENTION

The present invention is a horizontal-mount bracket system for holding sensor position with respect to a horizontal-mount bracket once the air gap is first established by the gauging layer method; and, in a second embodiment thereof, for locking the sensor position with respect to the horizontal-mount bracket, wherein the sensor may be removed and then reinstalled without use of any position setting procedure, yet the air gap is automatically precisely reset to its original value.

The horizontal-mount bracket system according to the present invention includes a multi-component bracket, having at least first and second bracket members which lay juxtaposed, one atop the other. The first bracket member has a first sensor opening and a first bolt hole; the second bracket member has a second sensor opening and a second bolt hole. The spacing between the first sensor opening and the first bolt hole is different from the spacing between the second sensor opening and the second bolt hole. Preferably, the distal ends (adjacent the first and second bolt holes) of the multi-component bracket are free, while the near ends (adjacent the first and second sensor openings) are vertically held but horizontally slidable, as for example by a fold-over of the first bracket member with respect to the second bracket member. The first and second sensor openings mutually communicate and the first and second bolt holes mutually communicate, wherein initially the first and second sensor openings are mutually aligned and the first and second bolt holes are mutually misaligned by an offset distance.

Preferably, the sensor body is placed trappingly into the first and second sensor openings of the multi-component bracket as part of the manufacturing process. This not only ensures that the sensor will remain permanently associated with respect to the multi-component bracket, but further ensures the orientation of the sensor with respect to the multi-component bracket will be correct.

Operationally, the sensor body is placed into a sensor port of an engine block so that the gauging layer comes to rest upon a surface of a reluctor. The gauging layer thereupon immediately establishes the optimum air gap between the sensor and the reluctor along a vertical axis (parallel to the cylindrical axis of the sensor port).

With the multi-component bracket resting upon a horizontal surface of the engine block, the first and second bolt holes are jointly placed over a threaded mounting hole of the horizontal surface. The threaded shank of a tapered bolt is then passed freely through the first and second bolt holes without displacing them, and then threaded into the threaded mounting hole. When a larger diameter neck of the tapered bolt encounters the first and second bolt holes, they are laterally displaced relative to each other along a horizontal axis (parallel to the horizontal surface). This displacement causes the first and second sensor openings to be horizontally displaced relative to each other, wherein the respective perimeters thereof forcibly abut respectively opposite sides of the sensor body, thereby securing the sensor body to the multi-component bracket by the facial interaction therebetween, such as for example friction or deformation of the sensor body.

In a second embodiment, a multi-component bracket is in the form of first and second bracket members as described, but now each of the first and second bracket members has a substantially semi-circular flange, wherein the flanges are positioned diametrically opposite each other with respect to the horizontal axis.

In a third embodiment, a multi-component bracket is in the form of a first bracket member having a folded-over U-shape, and a second bracket member located in sandwiched relation to the first bracket member. The first bracket member has a pair of aligned first sensor openings and a pair of aligned bolt holes, while the second bracket member has a second sensor opening initially aligned with the pair of first sensor openings and a second bolt hole initially off-set in relation to the pair of first bolt holes along the horizontal axis.

In a fourth embodiment, the multi-component bracket is as generally recounted, but now a sleeve is located at the first and second bolt holes. Upon the neck of the taper bolt encountering the sleeve, the sleeve is permanently expanded, causing permanent lateral displacement along the horizontal axis of the first and second bracket members. This embodiment has the advantage of locking the sensor body to the position determined by the gauging layer, which position is retained for re-mounting the sensor independent of the abraded state of the gauging layer.

Accordingly, it is an object of the present invention to provide a horizontal-mount bracket system which affixes a sensor body to a horizontal-mount bracket at a positional location indicative of a preset air gap of the sensor.

It is an additional object of the present invention to provide a horizontal-mount bracket system which locks a sensor body to a horizontal-mount bracket at a positional location indicative of a preset air gap of the sensor.

These, and additional objects, advantages, features and benefits of the present invention will become apparent from the following specification.

DESCRIPTION OF THE PREFERRED EMBODIMENT

Figure 1:
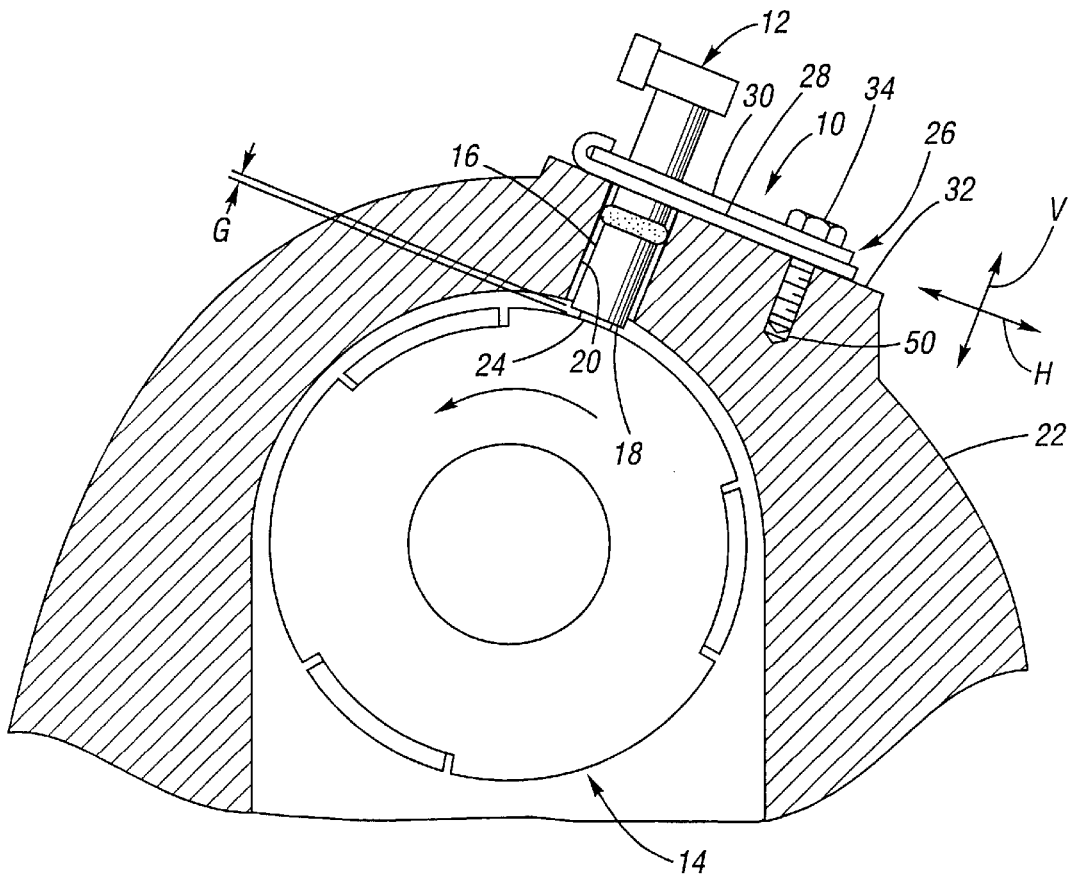
FIG. 1 is a partly sectional side view of the horizontal-mount bracket system according to the present invention, shown in a typical environment of operation wherein a magnetic sensor is spaced from a reluctor a distance equal to an optimum air gap that is established by a gauging layer.

Referring now to the Drawings, FIG. 1 generally depicts the horizontal-mount bracket system 10 according to the present invention in an exemplar environment of operation, wherein the horizontal-mount bracket system serves to locate a magnetic sensor 12 with respect to a reluctor 14. In this regard, the magnetic sensor 12 has a sensor body 16 which includes a sensor tip 18. The sensor tip 18 extends into a sensor port 20 of an engine block 22 and is spaced from the reluctor 14 a predetermined distance equal to an optimum air gap G which provides optimal sensing performance by the magnetic sensor of magnetic field variations as the reluctor spins.

The air gap G is defined when a gauging layer 24, which is attached to, or is a formed part of, the sensor tip 18 abuts the reluctor 14, as shown. The gauging layer 24 is composed of a soft abradable material which is sacrificed to abrasion as the reluctor rotates when differential thermal expansion and/or run-out causes the gauging layer to rub against the reluctor.

A horizontal-mount multi-component bracket 26 (hereafter, simply "multi-component bracket") of the horizontal-mount bracket system 10 is composed of a first bracket member 28 and a second bracket member 30 which lie juxtaposed flatly on a flat horizontal surface 32 which is oriented normal to the sensor port 20 (the cylindrical axis of which is along the vertical axis V). A tapered bolt 34 secures the multi-component bracket 26 to the horizontal surface 32. The multi-component bracket 26 holds the sensor body 16 at the position defined by the gauging layer via a lateral displacement of the first and second bracket members along the horizontal axis H, the nature of which is shown at FIGS. 2 through 4.

Preferably, the sensor body 16 is placed trappingly into the first and second sensor openings 36, 38 of the multi-component bracket 26 as part of the manufacturing process. This not only ensures that the sensor 12 will remain permanently associated with respect to the multi-component bracket 26, but further ensures the orientation of the sensor with respect to the multi-component bracket will be correct. The former feature facilitates installation at an assembly plant, the latter feature ensures that a directionally sensitive sensor will be properly oriented with respect to the direction of rotation of the reluctor 14.

Figure 2:
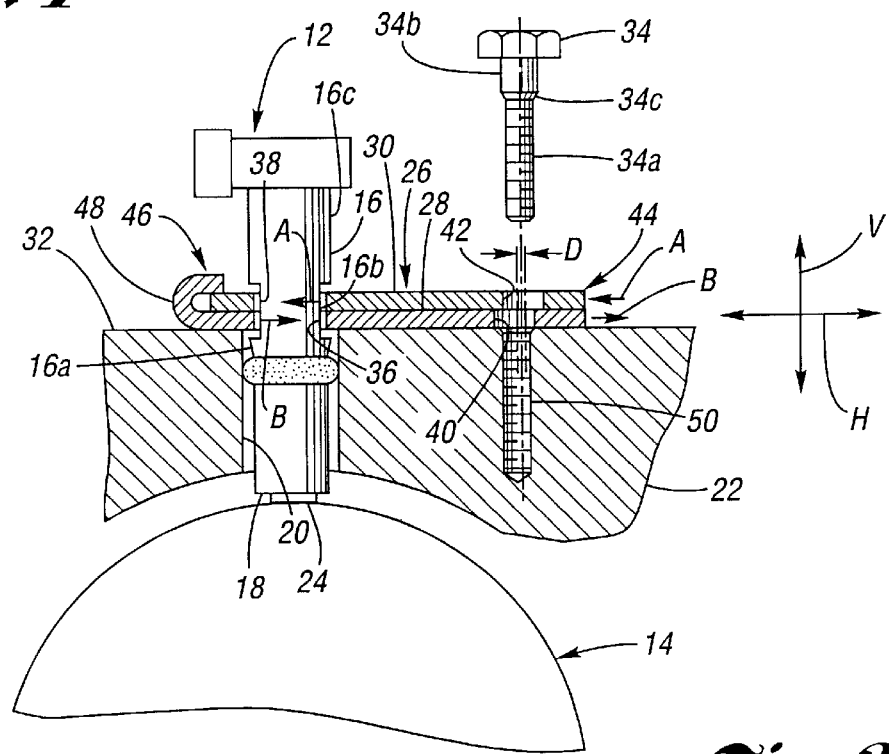
FIG. 2 is a partly sectional side view of a first embodiment of the horizontal-mount bracket system according to the present invention shown prior to displacement.
Figure 3:
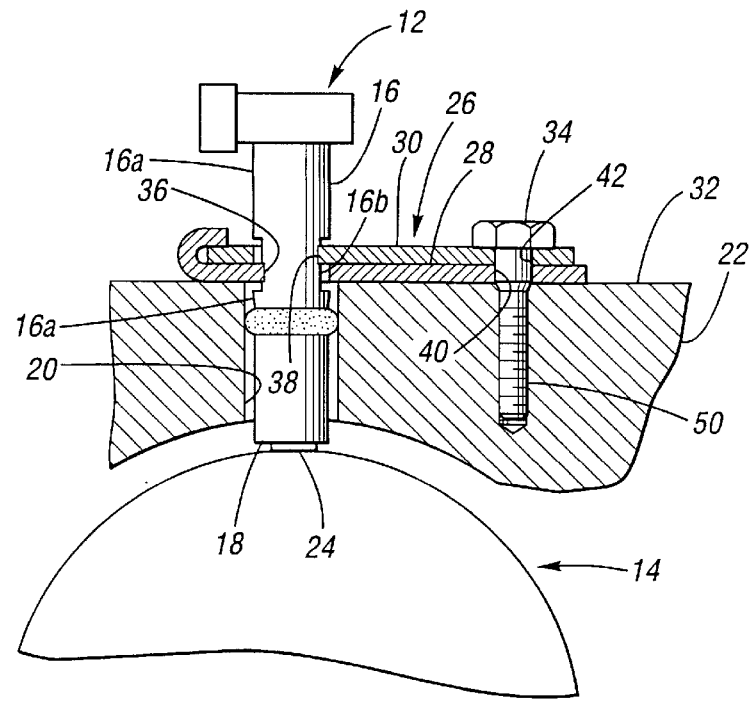
FIG. 3 is a partly sectional side view of the first embodiment of the horizontal-mount bracket system according to the present invention shown after displacement by a tapered bolt.
Figure 4:
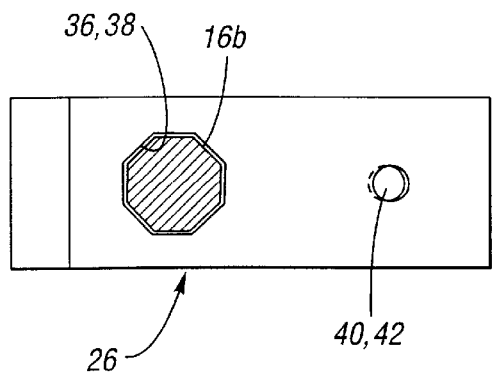
FIG. 4 is a partly sectional top view of a sensor receivingly trapped by a multi-component bracket of the first embodiment of the horizontal-mount bracket system according to the present invention shown prior to displacement.

An example of a modality for trapping and retaining the orientation of the sensor 12 with respect to the multi-component bracket 26 is shown at FIGS. 2 through 4. The first and second sensor openings 36, 38 are polygonal (hexagonal) in shape to prevent the sensor body, which is complementarily shaped to the polygonal shape of the first and second sensor openings, from rotating during installation. The sensor body 16 has a flared portion 16a which abuts a thinly cross-sectioned slot portion 16b, which, in turn, abuts a wide cross-sectioned portion 16c. The flared portion 16a enables the sensor body 12 to pass into the first and second sensor openings sufficiently to be trapped at the thinly cross-sectioned portion 16b.

Figure 4A:
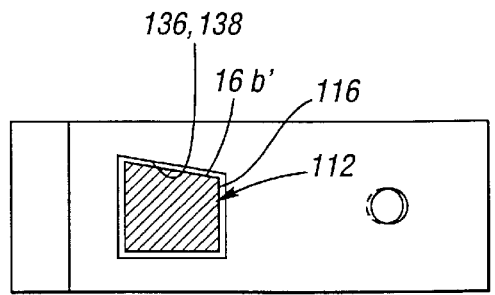
FIGS. 4A and 4B show partly sectional views of a sensor receivingly trapped and oriented by alternative multi-component brackets.
Figure 4B:
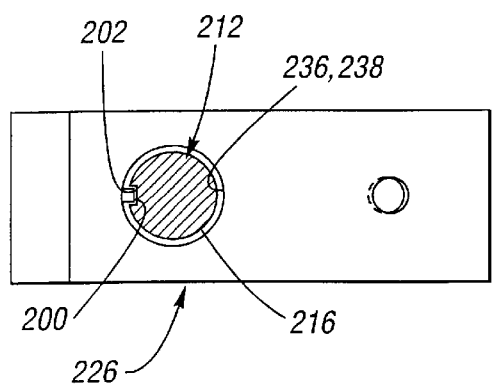

Another example of a modality for a multi-component bracket 126 to trap and retain the orientation of a sensor 112 is shown at FIG. 4A. A thinly shaped cross-sectioned portion 16b' of the sensor body 116 of the sensor 112 is complementarily shaped with respect to non-symmetrically shaped first and second sensor openings 136, 138 of the multi-component bracket 126.

Another example of a modality for trapping and retaining the orientation of a sensor 212 with respect to a multi-component bracket 226 is shown at FIG. 4C. The first and second sensor openings 236, 238 are symmetrically shaped and one thereof is provided with a tab 200. The tab 200 is trapped in a vertical groove 202 formed in the sensor body 216.

It is to be understood that those ordinarily skilled in art may utilize any known modality to trap and/or permanently orient the sensor with respect to the multi-component bracket, and that the various views of the present disclosure show various modalities merely by way of exemplification and not limitation.

Referring now to FIGS. 2 through 4, the first bracket member 28 has a first sensor opening 36 and a first bolt hole 40. The second bracket member 30 has a second sensor opening 38 and a second bolt hole 42. The spacing between the first sensor opening 36 and the first bolt hole 40 is a first distance, and the spacing between the second sensor opening 38 and the second bolt hole 42 is a second distance, wherein the first and second distances are different by an offset distance D (see FIG. 2). Preferably, the distal ends 44 (adjacent the first and second bolt holes) of the multi-component bracket 26 are free, while the near ends 46 (adjacent the first and second sensor openings) are vertically held but horizontally slidable, as for example by a fold-over 48 of the first bracket member with respect to the second bracket member. The first and second sensor openings mutually communicate and the first and second bolt holes mutually communicate, wherein initially the first and second sensor openings are mutually aligned and the first and second bolt holes are mutually misaligned by an amount equal to the offset distance D. Preferably, the sensor body 16 is trapped and oriented with respect to the first and second sensor openings 36, 38, which are mutually aligned, during manufacture.

Installation of the sensor body is as follows. The sensor body 16, gauging layer 24 first, is placed into the sensor port 20 so that the gauging layer comes to rest upon a surface of the reluctor 14. The gauging layer thereupon immediately establishes the optimum air gap between the sensor and the reluctor along the vertical axis V.

With the multi-component bracket 26 resting upon the horizontal surface 32, the first and second bolt holes 40, 42 are jointly placed over the threaded mounting hole, as shown at FIG. 2. The first and second bolt holes are misaligned relative to each other by the offset distance D, wherein the resulting misaligned cross-section is less than the cross-section of either of the first and second bolt holes. The threaded shank of a tapered bolt is passed freely through the off-set first and second bolt holes without displacing them, and then threaded into the threaded mounting hole 50. The tapered bolt 34 has a threaded shank 34a, a larger diameter neck 34b and a taper 34c therebetween. The neck 34b has a cross-section just less than that of the cross-section of either of the first and second bolt holes and larger, by the offset distance, than that of the misaligned cross-section. Accordingly, the neck 34b cannot pass through the off-set first and second bolt holes 40, 42 without laterally displacing them along the horizontal axis H into mutual alignment.

As the tapered bolt 34 threads into the threaded mounting hole 50, the neck 34b encounters first and second bolt holes 40, 42, whereupon they are laterally displaced relative to each other along a horizontal axis into mutual alignment, the first bracket member movable in the direction of arrow B and the second bracket member movable in the opposite direction of arrow A. The lateral displacement of the first bracket member with respect to the second bracket member causes the first and second sensor openings to be relatively horizontally displaced out of mutual alignment. Accordingly, the respective perimeters of the first and second sensor openings 36, 38 forcibly and opposably abut against the sensor body, thereby securing it by a facial interaction at the abutment, such as for example friction or deformation, to the multi-component bracket, as shown at FIG. 3.

Figure 5:
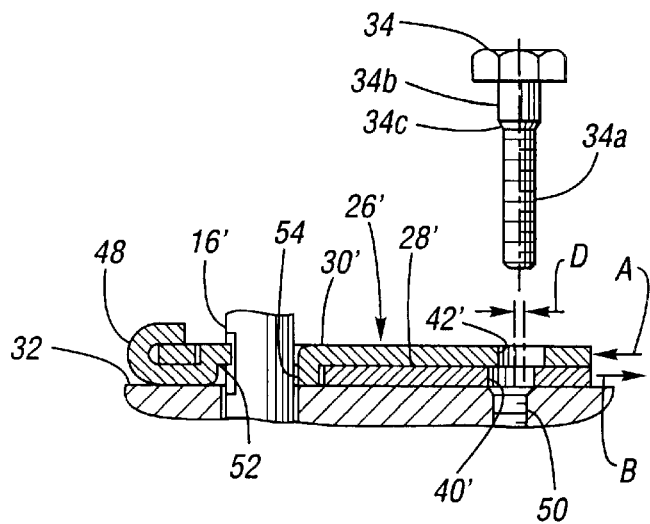
FIG. 5 is a partly sectional side view of a second embodiment of the horizontal-mount bracket system according to the present invention shown prior to displacement.
Figure 6:
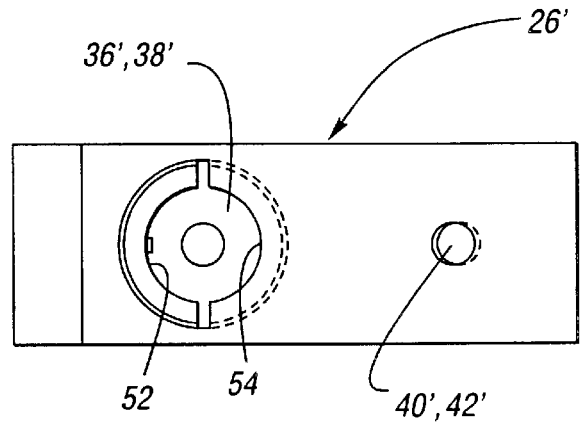
FIG. 6 is a top plan view of a multi-component bracket of the second embodiment of the horizontal-mount bracket system according to the present invention shown prior to displacement.
Figure 7:
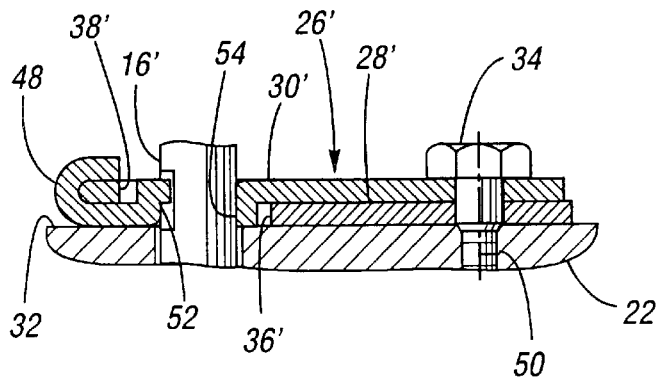
FIG. 7 is a partly sectional side view of the second embodiment of the horizontal-mount bracket system according to the present invention shown after displacement.

Turning attention now to FIGS. 5 through 7 a second embodiment of the horizontal-mount bracket system will be detailed.

The multi-component bracket 26' is generally as described above, having juxtaposed first and second bracket members 28', 30' having first and second bolt holes 40', 42' which are offset at the threaded mounting hole 50, except now substantially semi-circular first and second flanges 52, 54 are formed at the first and second sensor openings 36', 38'. The first flange 52 is integral with the first bracket member 28', is upstanding in the vertical axis into the second sensor opening 38', and is located distally in relation to the first bolt hole 40'. The second flange 54 is integral with the second bracket member 30', is upstanding in the vertical axis into the first sensor opening 36', and is located proximately in relation to the first bolt hole 40', wherein the first and second flanges are diametrically opposed to each other along the horizontal axis, as shown at FIG. 6.

Manufacture and installation of the multi-component bracket 26' with respect to the sensor body 16' is as generally recounted above. Now, as the tapered bolt 34 threads into the threaded mounting hole 50, the neck 34b encounters first and second bolt holes 40', 42', whereupon they are laterally displaced with respect to each other along a horizontal axis into mutual alignment, the first bracket member 28' movable in the direction of arrow B and the second bracket member 30' movable in the opposite direction of arrow A. The lateral displacement of the first bracket member with respect to the second bracket member causes the first and second sensor openings 36', 38' to be relatively horizontally displaced out of mutual alignment. Accordingly, the respective perimeters of the first and second sensor openings 36', 38', as defined by the first and second flanges 52, 54, forcibly and opposably abut against the sensor body, thereby securing it by a facial interaction at the abutment, such as for example friction or deformation, to the multi-component bracket, as shown at FIG. 7.

Figure 8:
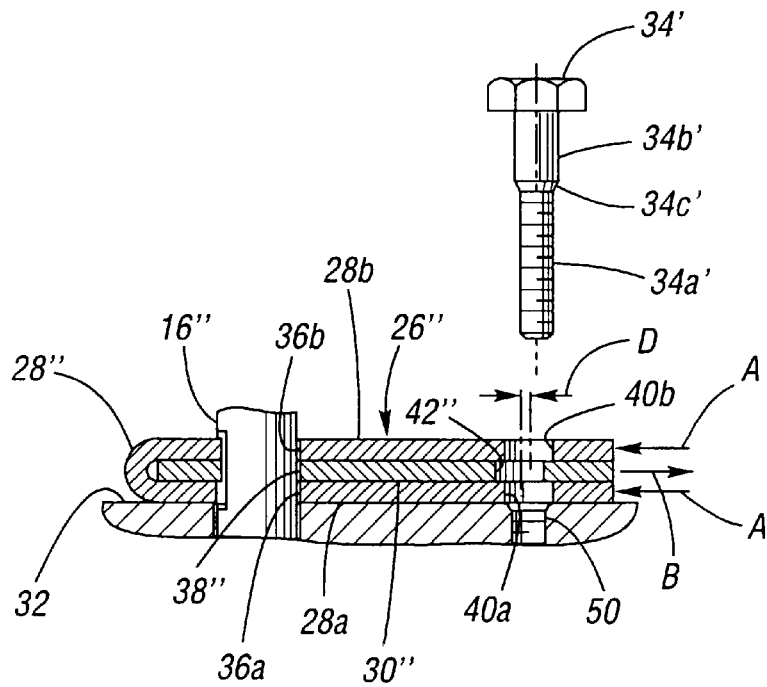
FIG. 8 is a partly sectional side view of a third embodiment of the horizontal-mount bracket system according to the present invention shown prior to displacement.
Figure 9:
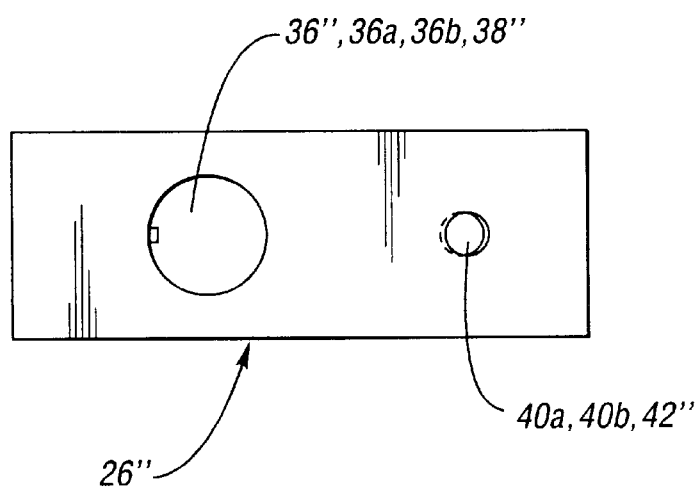
FIG. 9 is a top plan view of a multi-component bracket of the third embodiment of the horizontal-mount bracket system according to the present invention shown prior to displacement.
Figure 10:
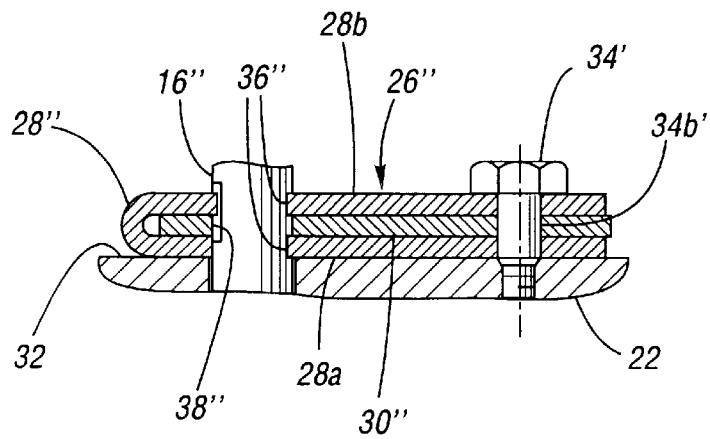
FIG. 10 is a partly sectional side view of the third embodiment of the horizontal-mount bracket system according to the present invention shown after displacement.
Figure 11:
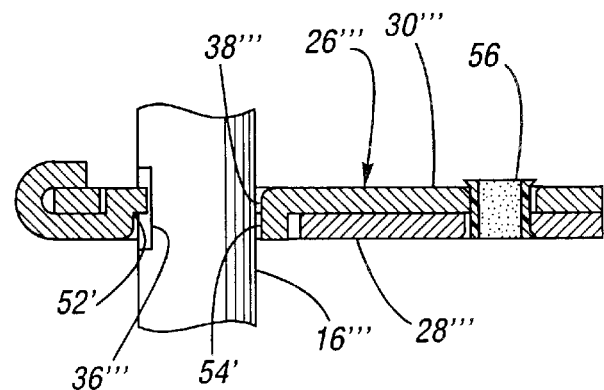
FIG. 11 is a partly sectional detail side view of a fourth embodiment of the horizontal-mount bracket system according to the present invention shown prior to displacement by a tapered bolt.
Figure 12:
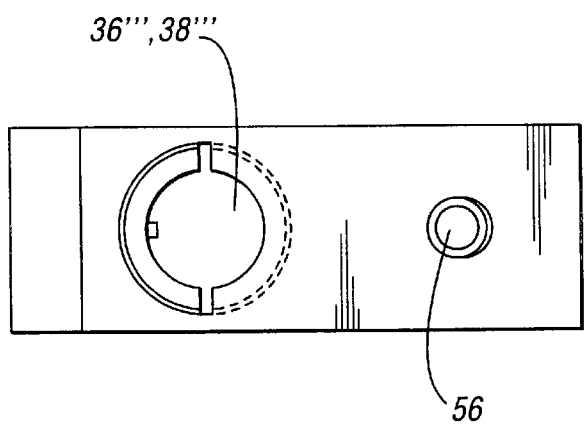
FIG. 12 is a top plan view of the fourth embodiment of the horizontal-mount bracket system according to the present invention shown prior to displacement.
Figure 13:
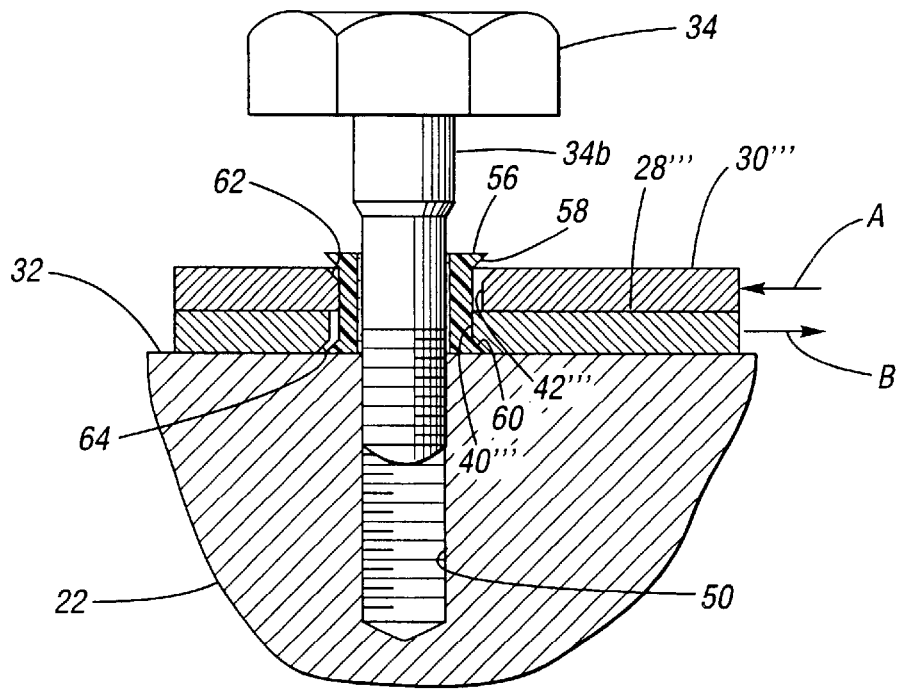
FIG. 13 is a partly sectional detail side view of a multi-component bracket of the fourth embodiment of the horizontal-mount bracket system according to the present invention shown prior to displacement.
Figure 14:
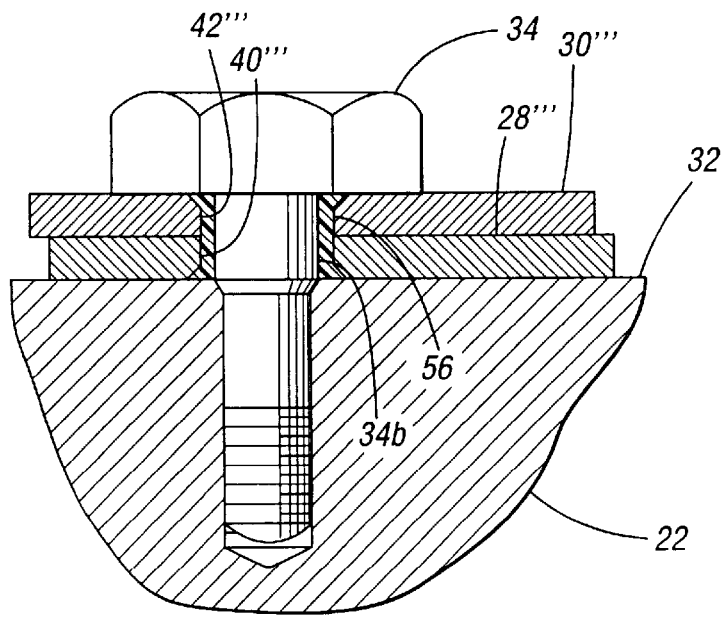
FIG. 14 is a partly sectional detail side view of a fourth embodiment of the horizontal-mount bracket system according to the present invention shown after displacement by the tapered bolt.

Turning attention now to FIGS. 8 through 10 a third embodiment of the horizontal-mount bracket system will be detailed.

The multi-component bracket 26" has a second bracket member 30" having a second sensor opening 38" and a second bolt hole 42", but now the first bracket member 28" is U-shaped, having a lower first bracket member 28a and an upper first bracket member 28b. Each of the lower and upper first bracket members 28a, 28b have, respectively, a lower first sensor opening 36a, an upper first sensor opening 36b, a lower first bolt hole 40a, and an upper first bolt hole 40b.

In this regard, the lower first sensor opening 36a is aligned with the upper first sensor opening 36b, wherein the upper and lower first sensor openings provide a collective first sensor opening 36". The lower first bolt hole 40a is aligned with the upper first bolt hole 40b.

As shown at FIGS. 8 and 9, when not displaced, the collective first sensor opening 36" is aligned with the second sensor opening 38", however, the lower and upper bolt holes 40a, 40b are both equally displaced with respect to the second bolt hole 42" an offset distance D, as described above.

Manufacture and installation of the multi-component bracket 26" with respect to the sensor body 16" is as generally recounted above. Now, as a tapered bolt 34' having a threaded shank 34a', an elongated neck 34b' and a taper 34c' therebetween is threaded into the threaded mounting hole 50, the neck 34b' encounters the lower and upper first bolt holes 40a, 40b and the second bolt hole 42", whereupon the lower and upper first bolt holes are both laterally displaced with respect to the second bolt hole along the horizontal axis into mutual alignment, the first bracket member 28" movable in the direction of arrow B and the second bracket member 30" movable in the opposite direction of arrow A. The lateral displacement of the first bracket member with respect to the second bracket member causes the lower and upper first sensor openings 36a, 36b and the second sensor opening 38" to be also horizontally displaced out of mutual alignment. Accordingly, the respective perimeters of the collective first sensor opening 36" and the second sensor opening 38" forcibly and opposably abut against the sensor body, thereby securing it by a facial interaction at the abutment, such as for example friction or deformation, to the multi-component bracket, as shown at FIG. 10.

Turning attention now to FIGS. 11 through 14 a fourth embodiment of the horizontal-mount bracket system will be detailed.

The multi-component bracket 26''' is generally as described above, having juxtaposed first and second bracket members 28''', 30''' having mutually aligned first and second sensor openings 36''', 38''' (which may be as in either of the first or second embodiments described above) and having first and second bolt holes 40''', 42''' which are offset at the threaded mounting hole 50 (see FIG. 13), wherein now a sleeve 56 is located in each of the first and second bolt holes. The sleeve 56 preferably has upper and lower flared ends 58, 60 which are interferingly interfaced with respectively opposing upper and lower chamfers 62, 64 of the multi-component bracket 26''', thereby trapping the sleeve in the first and second bolt holes. The purpose of the sleeve 56 is to provide permanency to the displacement of the first and second bracket members, in that the neck 34b of the tapered bolt 34 will cause the sleeve to be permanently expanded when the tapered bolt is threaded into the threaded mounting hole 50.

Preferably, the deformation of the sleeve is laterally expansive and vertically compressive. In this regard the lower flared end 60 is flush with the first bracket member 28''', and the upper flared end 58 is raised in relation to the second bracket member 30''' (see FIG. 13). Accordingly, vertical compression of the sleeve occurs as the bolt 34 is threaded tight and the upper flared end 58 is deformed so as to become flush with the second bracket member 30'''. The lateral expansion and vertical compression serve, respectively, to lock the sleeve horizontally and vertically with respect to the multi-component bracket 26'''. In this form of the invention, the tapered bolt can be unthreaded, the multi-component bracket 10 then removed (with the sensor body 16 permanently engaged therewith via operation of the expanded sleeve), and then, when replaced, the sensor tip air gap G is again precisely restored without need of the gauging layer 24.

Manufacture and installation of the multi-component bracket 26''' with respect to the sensor body 16''' is as generally recounted above. Now, as the tapered bolt 34 threads into the threaded mounting hole 50, the neck 34*b* encounters the sleeve 56, whereupon the sleeve is horizontally expanded and vertically compressed at the first and second bolt holes 40''', 42''' thereby causing the first and second bracket members 28''', 30''' to be laterally displaced relative to each other along a horizontal axis into mutual alignment, the first bracket member 28''' movable in the direction of arrow B and the second bracket member 30''' movable in the opposite direction of arrow A. The lateral displacement of the first bracket member with respect to the second bracket member causes the first and second sensor openings 36''', 38''' to be relatively horizontally displaced out of mutual alignment. Accordingly, the respective perimeters of the first and second sensor openings 36''', 38''', as defined by the first and second flanges 52', 54', forcibly and opposably abut against the sensor body, thereby securing it by a facial interaction at the abutment, such as for example friction or deformation, to the multi-component bracket, as analogously shown at FIG. 7.

Now, if the sensor 12 ever needs to be removed, it can later be reinstalled by simply running the tapered bolt through the sleeve and into the threaded mounting hole, and the fixed position of the washer in relation to the bracket provides a memory of the prior preset air gap G.

To those skilled in the art to which this invention appertains, the above described preferred embodiments may be subject to change or modification. For example, displacement modalities other than a tapered bolt and offset bolt hole combination may be used to accomplish lateral displacement of the bracket members of the multi-component bracket so as to cause holdable pinching of the sensor body with respect thereto. Further for example, other modalities may be used to lock the relative position of the first and second sensor openings after displacement, as for example an auxiliary locking screw or bolt passing through auxiliary aligned holes in the first and second bracket members after displacement. Such change or modification can be carried out without departing from the scope of the invention, which is intended to be limited only by the scope of the appended claims.

What is claimed is:

1. A horizontal-mount bracket system for retaining position of an article with respect to a horizontal surface, comprising:
   a multi-component bracket comprising a first bracket member having a first opening, and a second bracket member having a second opening, said first and second bracket members being juxtaposed, wherein said first and second openings mutually communicate;
   mounting means for mounting said multi-component bracket upon a horizontal surface which is parallel to a horizontal axis; and
   displacement means for displacing the first and second bracket members relative to each other along the horizontal axis;
   wherein said displacement means displaces said first and second openings relative to each other from a first relative position whereat said first and second openings are substantially mutually aligned to a second relative position whereat said first and second openings are mutually misaligned by an offset distance.

2. The horizontal-mount bracket system of claim 1, further comprising means for retaining said first and second bracket members in said juxtaposed relationship at said first and second openings.

3. The horizontal-mount bracket system of claim 2, wherein said mounting means and said displacement means comprise:
   a tapered bolt having a threaded shank having a first cross-section, a neck having a second cross-section and a taper therebetween, wherein said second cross-section is larger than said first cross-section;
   said first bracket member having a first bolt hole separated from said first opening a first distance; and
   said second bracket member having a second bolt hole communicating with said first bolt hole, said second bolt hole being separated from said second opening a second distance, said first and second distances differing by an amount equal to said offset distance;
   wherein when said first and second openings are mutually aligned, said first and second bolt holes are mutually misaligned by said offset distance;
   wherein said threaded shank is passable through said first and second bolt holes when said first and second bolt holes are mutually misaligned by said offset distance, and wherein said neck is passable through said first and second bolt holes only when said first and second bolt holes are substantially mutually aligned; and
   wherein said first and second openings are mutually misaligned by said offset distance when said neck is located in said first and second bolt holes.

4. The horizontal-mount bracket system of claim 3, wherein said first bracket member has a substantially semicircular first flange located in said second opening; and wherein said second bracket member has a substantially semicircular second flange located in said first opening, wherein said first and second flanges are diametrically opposed along said horizontal axis.

5. The horizontal-mount bracket system of claim 3, wherein said first bracket member has a U-shape comp rising an upper first bracket member and a lower first bracket member, wherein said second bracket member is located therebetween; where in said first opening comp rises a lower first opening formed in said lower first bracket member a nd an upper first sensor opening formed in said upper first bracket member, said upper and lower first openings being mutually aligned; and wherein said first bolt hole comprises a lower first bolt hole formed in said lower first bracket member and an upper first bolt hole formed in said upper first bracket member, said upper and lower first bolt holes being mutually aligned.

6. The horizontal-mount bracket system of claim 3, further comprising sleeve means trapped in said first and second bolt holes for deforming responsive to said neck entering into said sleeve means, wherein the deforming of said sleeve means provides said displacement of said first and second openings relative to each other from said first relative position to said second relative position, wherein said sleeve means permanently retains said first and second openings at said second relative position.

7. The horizontal-mount bracket system of claim 6, wherein said deformation of said sleeve means comprises a lateral expansion in a plane parallel to the horizontal axis and a vertical compression perpendicular to the horizontal axis.

8. A horizontal-mount bracket system for retaining position of a sensor with respect to a horizontal surface, comprising:
   a sensor having a sensor body;
   a multi-component bracket comprising a first bracket member having a first sensor opening, and a second bracket member having a second sensor opening, said first and second bracket members being juxtaposed, wherein said first and second sensor openings mutually communicate;

mounting means for mounting the multi-component bracket upon a horizontal surface which is parallel to a horizontal axis; and displacement means for displacing the first and second bracket members along the horizontal axis;

wherein said displacement means displaces said first and second sensor openings relative to each other from a first relative position whereat said first and second sensor openings are substantially mutually aligned to a second relative position whereat said first and second sensor openings are mutually misaligned by an offset distance, wherein at said first relative position said sensor body is movable within said first and second sensor openings, and wherein at said second relative position respective perimeters of said first and second sensor openings facially interact with said sensor body to thereby holdably affix said sensor body with respect to said multi-component bracket.

9. The horizontal-mount bracket system of claim 8, further comprising means for retaining said first and second bracket members in said juxtaposed relationship at said first and second sensor openings.

10. The horizontal-mount bracket system of claim 9, wherein said mounting means and said displacement means comprise:

a tapered bolt having a threaded shank having a first cross-section, a neck having a second cross-section and a taper therebetween, wherein said second cross-section is larger than said first cross-section;

said first bracket member having a first bolt hole separated from said first sensor opening a first distance; and said second bracket member having a second bolt hole communicating with said first bolt hole, said second bolt hole being separated from said second sensor opening a second distance, said first and second distances differing by an amount equal to said offset distance;

wherein when said first and second sensor openings are mutually aligned, said first and second bolt holes are mutually misaligned by said offset distance;

wherein said threaded shank is passable through said first and second bolt holes when said first and second bolt holes are mutually misaligned by said offset distance, and wherein said neck is passable through said first and second bolt holes only when said first and second bolt holes are substantially mutually aligned; and wherein said first and second sensor openings are mutually misaligned by said offset distance when said neck is located in said first and second bolt holes.

11. The horizontal-mount bracket system of claim 10, wherein said first bracket member has a substantially semicircular first flange located in said second sensor opening; and wherein said second bracket member has a substantially semicircular second flange located in said first sensor opening, wherein said first and second flanges are diametrically opposed along said horizontal axis.

12. The horizontal mount bracket system of claim 11, further comprising means for trapping said sensor body at said first and second sensor openings with a predetermined amount of vertical play perpendicular to the horizontal axis and at a predetermined orientation with respect to said multi-component bracket.

13. The horizontal-mount bracket system of claim 10, wherein said first bracket member has a U-shape comprising an upper first bracket member and a lower first bracket member, wherein said second bracket member is located therebetween; wherein said first sensor opening comprises a lower first sensor opening formed in said lower first bracket member and an upper first sensor opening formed in said upper first bracket member, said upper and lower first sensor openings being mutually aligned; and wherein said first bolt hole comprises a lower first bolt hole formed in said lower first bracket member and an upper first bolt hole formed in said upper first bracket member, said upper and lower first bolt holes being mutually aligned.

14. The horizontal mount bracket system of claim 13, further comprising means for trapping said sensor body at said first and second sensor openings with a predetermined amount of vertical play perpendicular to the horizontal axis and at a predetermined orientation with respect to said multi-component bracket.

15. The horizontal-mount bracket system of claim 10, further comprising sleeve means trapped in said first and second bolt holes for deforming responsive to said neck entering into said sleeve means, wherein the deforming of said sleeve means provides said displacement of said first and second openings relative to each other from said first relative position to said second relative position, wherein said sleeve means permanently retains said first and second openings at said second relative position, whereupon said sensor body is permanently affixed thereby to said multi-component bracket.

16. The horizontal-mount bracket system of claim 15, wherein said deformation of said sleeve means comprises a lateral expansion in a plane parallel to the horizontal axis and a vertical compression perpendicular to the horizontal axis.

17. The horizontal mount bracket system of claim 15, further comprising means for trapping said sensor body at said first and second sensor openings with a predetermined amount of vertical play perpendicular to the horizontal axis and at a predetermined orientation with respect to said multi-component bracket.

18. A method for setting and holding an air gap of a sensor tip of a sensor with respect to a reluctor using a multi-component horizontal-mount bracket comprising a first bracket member having a first opening and a second bracket member having a second opening, wherein the sensor has a sensor body and the sensor tip has a contact surface for contacting the reluctor, and wherein the reluctor is rotatable with respect to an engine housing, said method comprising the steps of:

mutually aligning the first and second openings of a multi-component horizontal-mount bracket;

placing a sensor body of a sensor through the mutually aligned first and second openings and into a sensor port of an engine housing, wherein a contact surface of the sensor contacts a reluctor and thereby sets an air gap between the reluctor and a tip of the sensor;

horizontally displacing the first and second openings relative to each other to thereby cause a facial interaction between the sensor body and the multi-component horizontal-mount bracket so as to holdably affix the sensor body to the multi-component horizontal-mount bracket; and securing the multi-component horizontal-mount bracket to a horizontal surface connected with the engine housing to thereby secure the location of the sensor tip to the reluctor.

19. The method of claim 18, wherein said step of displacing permanently displaces said first and second openings.

20. The method of claim 18, wherein said step of securing and horizontally displacing are performed simultaneously.

* * * * *